United States Patent
Nieh et al.

(10) Patent No.: US 9,698,057 B2
(45) Date of Patent: *Jul. 4, 2017

(54) METHOD OF MANUFACTURING STRAINED SOURCE/DRAIN STRUCTURES

(71) Applicant: Taiwan Semiconductor Manufacturing Company, Ltd., Hsin-Chu (TW)

(72) Inventors: Chun-Feng Nieh, Hsinchu (TW); Ming-Huan Tsai, Zhubei (TW); Wei-Han Fan, Hsin-Chu (TW); Yimin Huang, Hsinchu (TW); Chun-Fai Cheng, Hong Kong (HK); Han-Ting Tsai, Kaoshiung (TW); Chii-Ming Wu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/727,366

(22) Filed: Jun. 1, 2015

(65) Prior Publication Data

US 2015/0262886 A1 Sep. 17, 2015

Related U.S. Application Data

(63) Continuation of application No. 14/040,224, filed on Sep. 27, 2013, now Pat. No. 9,048,253, which is a (Continued)

(51) Int. Cl.
*H01L 21/8238* (2006.01)
*H01L 29/66* (2006.01)
(Continued)

(52) U.S. Cl.
CPC ........... *H01L 21/823814* (2013.01); *H01L 21/26586* (2013.01); *H01L 21/3065* (2013.01);
(Continued)

(58) Field of Classification Search
CPC ....... H01L 21/823814; H01L 21/26586; H01L 21/30604; H01L 21/3065; H01L 21/76224;
(Continued)

(56) References Cited

U.S. PATENT DOCUMENTS 5,413,945 A 5/1995 Chien et al.
5,650,340 A 7/1997 Burr et al.
(Continued)

FOREIGN PATENT DOCUMENTS

JP 2003-033201 2/1991
JP 2006-141642 6/2006

OTHER PUBLICATIONS

Flamm, Daniel L., "Mechanisms of Silicon Etching in Fluorine-and-Chlorine-Containing Plasmas" Pure & Appl. Chem., vol. 62, No. 9, pp. 1709-1720, 1990.
(Continued)

*Primary Examiner* — William Coleman
(74) *Attorney, Agent, or Firm* — Haynes and Boone. LLP

(57) ABSTRACT

An integrated circuit device and method for manufacturing the integrated circuit device is disclosed. The disclosed method provides improved control over a surface proximity and tip depth of an integrated circuit device. In an embodiment, the method achieves improved control by forming a doped region and a lightly doped source and drain (LDD) region in a source and drain region of the device. The doped region is implanted with a dopant type opposite to the LDD region.

20 Claims, 12 Drawing Sheets

Related U.S. Application Data continuation of application No. 12/913,041, filed on Oct. 27, 2010, now Pat. No. 8,569,139.

(51) Int. Cl.
*H01L 29/78* (2006.01)
*H01L 21/265* (2006.01)
*H01L 21/306* (2006.01)
*H01L 21/3065* (2006.01)
*H01L 21/762* (2006.01)

(52) U.S. Cl.
CPC .. *H01L 21/30604* (2013.01); *H01L 21/76224* (2013.01); *H01L 21/823807* (2013.01); *H01L 21/823878* (2013.01); *H01L 29/6659* (2013.01); *H01L 29/66492* (2013.01); *H01L 29/66636* (2013.01); *H01L 29/7834* (2013.01); *H01L 29/7848* (2013.01)

(58) Field of Classification Search
CPC ......... H01L 29/6659; H01L 21/823878; H01L 29/66492; H01L 29/7848; H01L 29/7834; H01L 29/66636; H01L 21/823807
See application file for complete search history.

(56) References Cited

U.S. PATENT DOCUMENTS

| | | | |
|---|---|---|---|
| 6,133,082 A | 10/2000 | Masuoka | |
| 6,214,679 B1 | 4/2001 | Murthy et al. | |
| 6,579,770 B2 | 6/2003 | Rodder et al. | |
| 6,585,841 B1 | 7/2003 | Popp et al. | |
| 7,078,285 B1 | 7/2006 | Suenaga | |
| 7,148,097 B2 | 12/2006 | Yu et al. | |
| 7,195,985 B2 | 3/2007 | Murthy et al. | |
| 7,479,432 B2 | 1/2009 | Murthy et al. | |
| 7,494,858 B2 | 2/2009 | Bohr et al. | |
| 7,989,299 B2 | 8/2011 | Fukutome et al. | |
| 8,062,454 B2 | 11/2011 | Yamamoto et al. | |
| 8,236,659 B2 * | 8/2012 | Tsai | H01L 21/26586 257/E21.619 |
| 8,501,570 B2 | 8/2013 | Fang et al. | |
| 8,569,139 B2 * | 10/2013 | Nieh | H01L 21/823807 257/E21.431 |
| 8,614,132 B2 * | 12/2013 | Tsai | H01L 21/26586 257/E21.619 |
| 8,900,960 B2 * | 12/2014 | Tsai | H01L 21/26586 438/300 |
| 9,048,253 B2 * | 6/2015 | Nieh | H01L 21/823807 |
| 2011/0025937 A1 | 2/2011 | Yagi et al. | |
| 2012/0108026 A1 | 5/2012 | Nieh et al. | |
| 2013/0017660 A1 | 1/2013 | Fang et al. | |
| 2014/0024188 A1 | 1/2014 | Nieh et al. | |

OTHER PUBLICATIONS

Li, Y.X., et al., "Fabrication of a Single Crystalline Silicon Capacitive Lateral Accelerometer Using Micromachining Based on Single Step Plasma Etching." 0-7803-2603-6, 1995, IEEE, pp. 396-403.
Kovacs, Gregory T.A., et al., "Bulk Micromachining of Silicon," Proceedings of the IEEE, vol. 86, No. 8, Aug. 1998, pp. 1536-1551.

* cited by examiner

METHOD OF MANUFACTURING STRAINED SOURCE/DRAIN STRUCTURES

PRIORITY DATA

This application is a continuation of U.S. patent application Ser. No. 14/040,224, filed Sep. 27, 2013, which is a continuation of U.S. patent application Ser. No. 12/913,041, files Oct. 27, 2010, issued as U.S. Pat. No. 8,569,139, each of which is hereby incorporated by reference in its entirety.

CROSS REFERENCE

The present disclosure is related to the following commonly-assigned U.S. patent applications, the entire disclosures of which are incorporated herein by reference: U.S. application Ser. No. 12/816,519 for "Integrated Circuit Device With Well Controlled Surface Proximity And Method Of Manufacturing Same".

TECHNICAL FIELD

The present disclosure relates to integrated circuit devices and methods for manufacturing integrated circuit devices.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often implements epitaxially grown silicon (Si) to form raised source and drain features for an n-type device, and epitaxially growing silicon germanium (SiGe) to form raised source and drain features for a p-type device. Various techniques directed at shapes, configurations, and materials of these source and drain features have been implemented to try and further improve transistor device performance. Although existing approaches have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
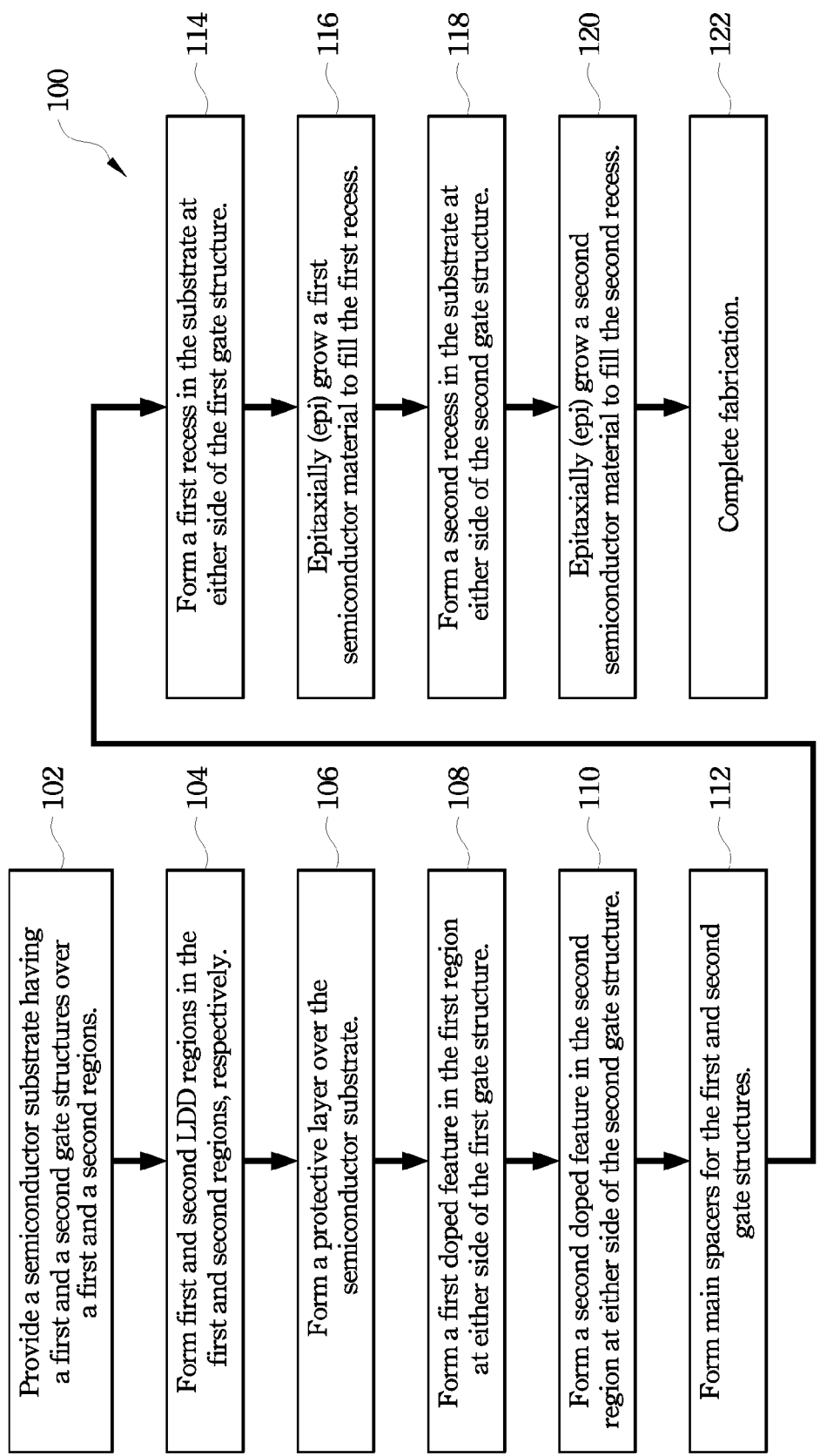
FIG. 1 is a flow chart of a method for fabricating an integrated circuit device according to an embodiment of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-10, a method 100 and a semiconductor device 200 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
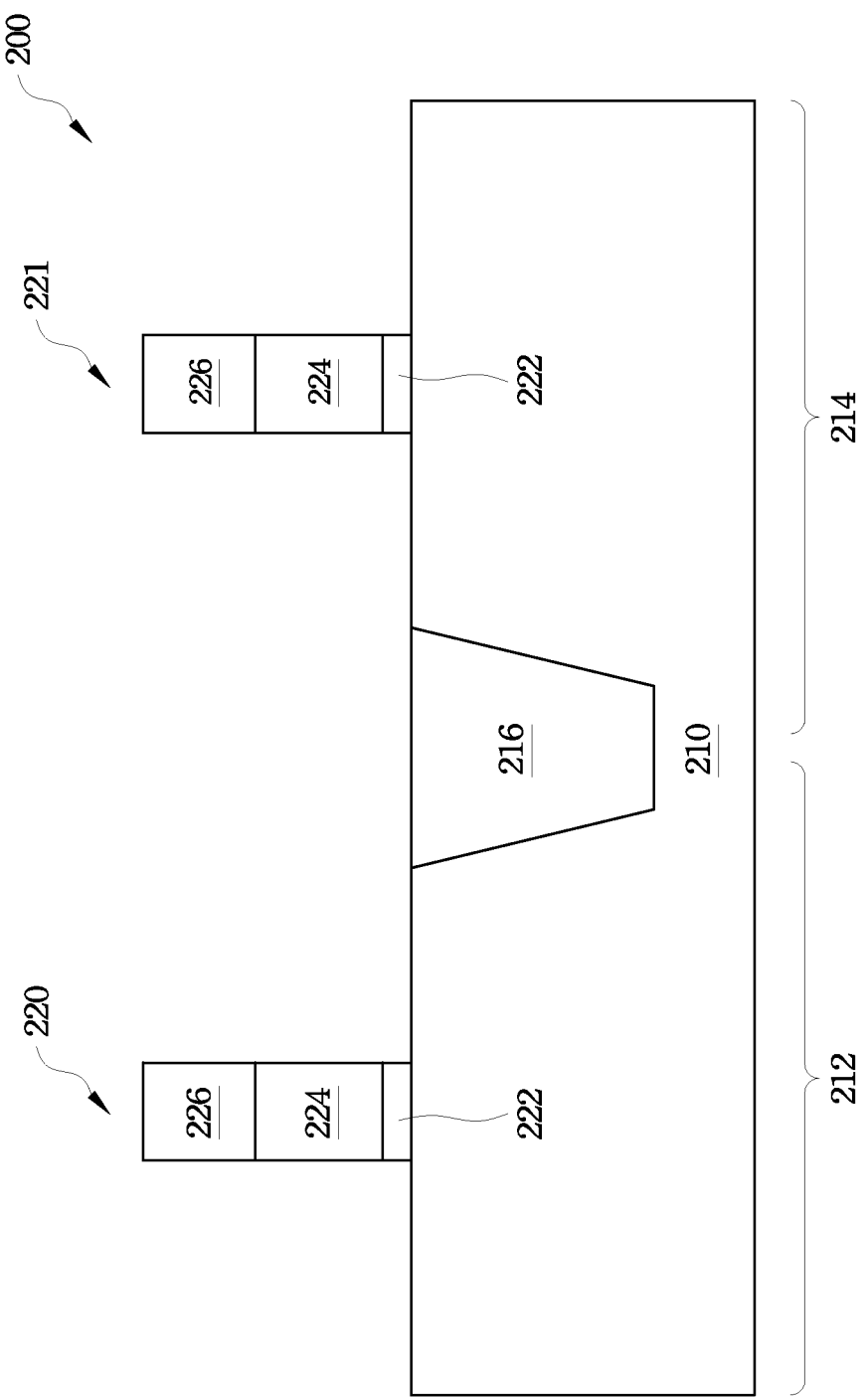
FIGS. 2-10 are various diagrammatic cross-sectional views of an embodiment of an integrated circuit device during various fabrication stages according to the method of FIG. 1.

Referring to FIGS. 1 and 2, the method 100 begins at step 102, wherein a substrate 210 is provided. In the present embodiment, the substrate 210 is a semiconductor substrate comprising silicon. Alternatively, the substrate 210 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 210 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 210, in a P-well structure, in an N-well structure, in a dual-well structure, or using a raised structure. The semiconductor device 200 includes a NFET device region 212 and a PFET device region 214 of the substrate 210, and thus, the substrate 210 may include various doped regions configured for a particular device in each of the NFET device region 212 and the PFET device region 214. A gate structure 220 for a NFET device and a gate structure 221 for a PFET device are formed over the NFET device region 212 and the PFET device region 214, respectively. In some embodiments, the gate structures 220 and 221 include, in order, a gate dielectric 222, a gate electrode 224, and a hard mask 226. The gate structures 220 and 221 may be formed by deposition, lithography patterning, and etching processes as known in the art.

The gate dielectric 222 is formed over the substrate 210 and includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfSiO, HfZrO, other suitable materials, or combinations thereof. The gate dielectric 222 may be a multilayer structure, for example, including an interfacial layer, and a high-k dielectric material layer formed on the interfacial layer. An exemplary interfacial layer may be a grown silicon oxide layer formed by a thermal process or atomic layer deposition (ALD) process.

The gate electrode 224 is formed over the gate dielectric 222. In some embodiments, the gate electrode 224 is a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the gate electrode 224 could include a conductive layer having a proper work function. Therefore, the gate electrode 224 can also be referred to as a work function layer. The work function layer 224 comprises any suitable material, such that the layer can be tuned to have a proper work function for enhanced performance of the associated device. For example, if a p-type work function metal (p-metal) for the PFET device is desired, TiN or TaN may be used. On the other hand, if an n-type work function metal (n-metal) for the NFET device is desired, Ta, TiAl, TiAlN, or TaCN, may be used. The work function layer may include doped conducting oxide materials. The gate electrode layer 224 may include other conductive materials, such as aluminum, copper, tungsten, metal alloys, metal silicide, other suitable materials, or combinations thereof. For example, where the gate electrode 224 includes a work function layer, another conductive layer can be formed over the work function layer.

The hard mask 226 formed over the gate electrode 224 includes silicon oxide, silicon nitride, silicon oxynitride, silicon carbide, other suitable dielectric material, or combinations thereof. The hard mask 226 may have a multi-layer structure.

An isolation feature 216 is formed in the substrate 210 to isolate various regions of the substrate 210, such as the NFET and the PFET device regions 212, 214. The isolation feature 216 utilizes isolation technology, such as local oxidation of silicon (LOCOS) and/or shallow trench isolation (STI), to define and electrically isolate the various regions. The isolation feature 216 comprises silicon oxide, silicon nitride, silicon oxynitride, other suitable materials, or combinations thereof. The isolation feature 216 may be formed by any suitable process. As one example, forming an STI includes etching a trench in the substrate, filling the trench with one or more dielectric materials, and using chemical mechanical polishing (CMP) processing to form a planarized surface.

Figure 3:
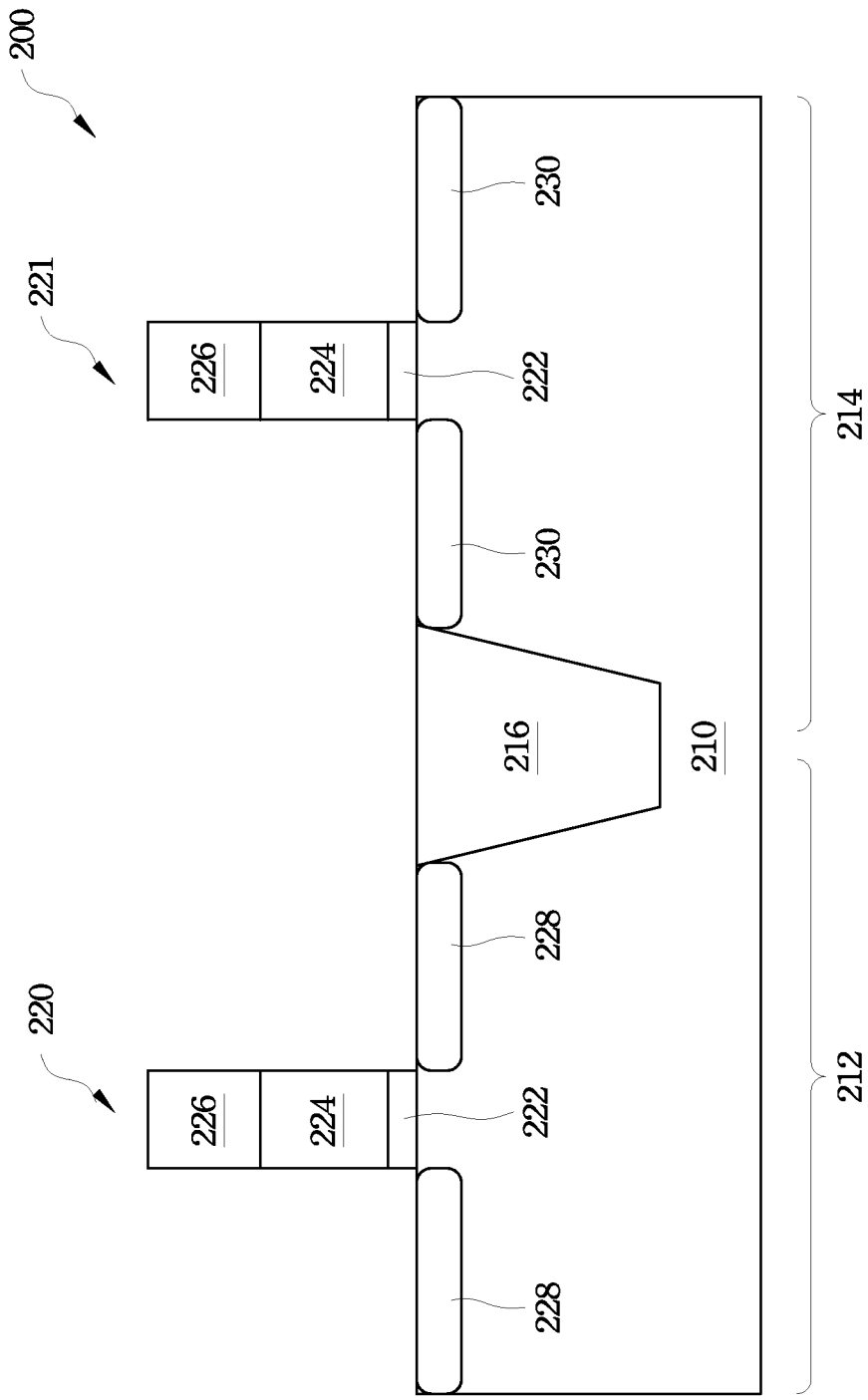

Referring to FIGS. 1 and 3, the method 100 continues with step 104 in which lightly doped source/drain (LDD) regions 228 are formed in the NFET device region 212, interposed by the gate structure 220; and LDD regions 230 are formed in the PFET device region 214, interposed by the gate structure 221. The LDD regions 228, 230 are substantially aligned with the sidewalls of the gate structures 220, 221, respectively. The LDD regions 228, 230 may be formed by an ion implantation process, diffusion process, other suitable process, or combination thereof. The PFET device region 214 may be protected during formation of the LDD regions 228 in the NFET device region 212, and the NFET device region 212 may be protected during formation of the LDD regions 230 in the PFET device region 214. In some embodiments, the LDD regions 228 for the NFET device (NLDD) are doped with an n-type dopant, such as phosphorous or arsenic, and the LDD regions 230 for the PFET device (PLDD) are doped with a p-type dopant, such as boron or $BF_2$.

Figure 4:
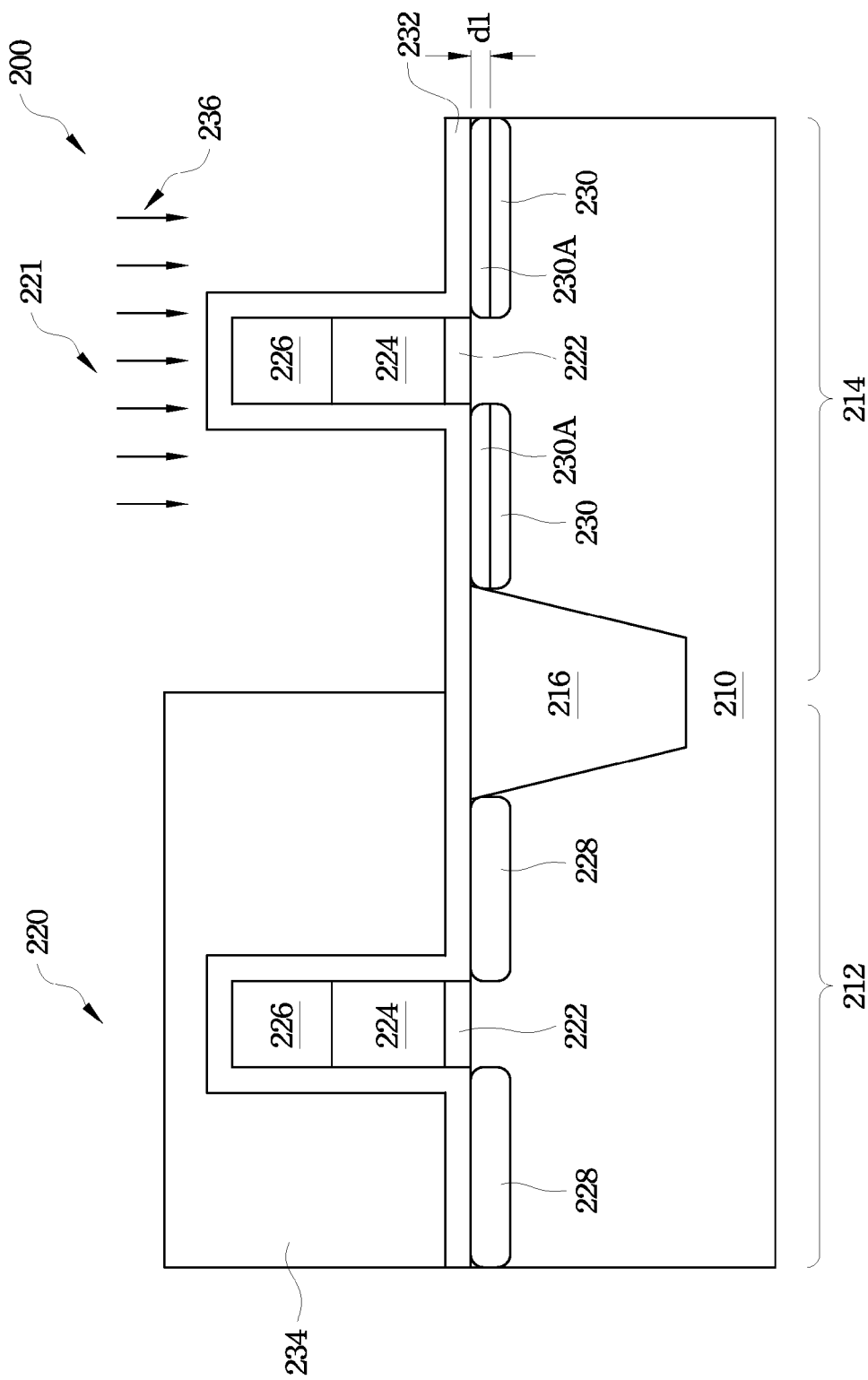

Referring to FIGS. 1 and 4, the method 100 continues with step 106 in which a protective layer 232 may be formed over the substrate 210. In one embodiment, the protective layer 232 is a dielectric layer. In another embodiment, the protective layer 232 is oxide material, e.g., silicon oxide or silicon oxynitride, or nitride material, e.g., silicon nitride. In some embodiments, the protective layer 232 has a thickness ranging between about 10 Angstroms to about 100 Angstroms. Still referring to FIGS. 1 and 4, the method 100 continues with step 108 in which doped features 230A are formed in the LDD regions 230 of the PFET device region 214 by providing an implantation process 236 to the substrate 210 and covering a resist pattern (or hard mask pattern) 234 over the NFET device region 212. In one embodiment, the doped features 230A are positioned in the upper portion of the LDD regions 230. In another embodiment, the doped features 230A extend from the top surface of the LDD regions 230 into the LDD regions 230 to a depth d1 ranging between about 10 Angstroms and about 100 Angstroms.

In some embodiments, the implantation process 236 introduces a dopant in the doped features 230A, which is opposite to the dopant for forming the LDD regions 230 and has a dosage substantially the same as the dosage for forming the LDD regions 230, thereafter to form the doped features 230A with electrically neutralized characteristics. In the depicted embodiment, since the LDD regions 230 are doped with p-type dopant, the doped features 230A are doped with n-type dopant, such as phosphorous or arsenic. The protective layer 232 acts as a mask during the implantation process 236, such that to control the doped features 230A positioned in the upper portion of the LDD regions 230. The implantation process 236, in some embodiments, is performed with a tilt-angle process ranging between about 30° to about 60° to form the doped features 230A substantially aligned with the sidewalls of the LDD regions 230 adjacent to the gate structure 221. The doped features 230A and the remaining LDD regions 230 may have different etching rates during a subsequent etching process because of the different doping species therein. For example, the remaining LDD regions 230 with the p-type dopant (e.g., B) may retard the etching process. On the other hand, the doped features 230A including the p-type dopant (e.g., B) and the opposite dopant (e.g., As) may form an electrically neutralized region and prevent the retardation phenomenon in the etching process. Thus, the etching rate of the doped features 230A is greater than the etching rate of the remaining LDD regions 230.

The patterned resist layer 234 is thereafter removed by a photoresist stripping process, for example. In one embodiment, an anneal process may be provided to the substrate 210, after the stripping process, to repair the crystalline structure of the substrate 210 damaged by the implantation process 236. The anneal process is performed with a nitrogen ambient under a temperature ranging between about 900° C. and about 1100° C.

Figure 5:
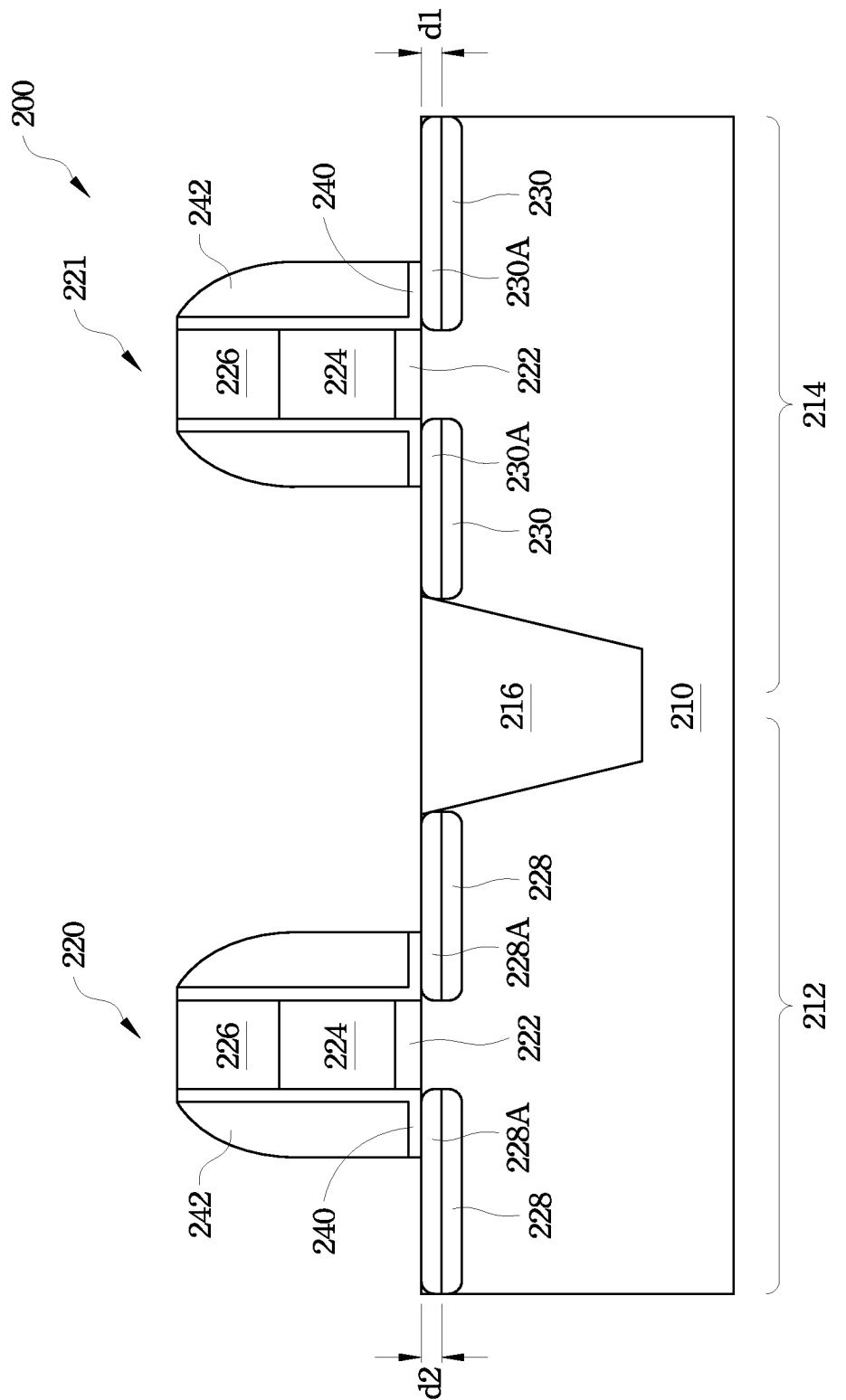

Referring to FIGS. 1 and 5, the method 100 continues with step 110 in which doped features 228A may be formed in the LDD regions 228 of the NFET device region 212 by an implantation process similar to the process as mentioned above. The PFET device region 214 may be covered by a resist or hard mask pattern (not shown) during the implantation process. In one embodiment, the doped features 228A are positioned in the upper portion of the LDD regions 228. In another embodiment, the doped features 228A extend from the top surface of the LDD regions 228 into the LDD regions 228 to a depth d2 ranging between about 10 Angstroms and about 100 Angstroms. In some embodiments, the implantation process introduces a dopant in the doped features 228A, which is opposite to the dopant for forming the LDD regions 228 and has a dosage substantially the same as the dosage for forming the LDD regions 228, thereafter to form the doped features 228A with electrically neutralized characteristics. In the depicted embodiment, since the LDD regions 228 are doped with n-type dopant, the doped features 228A are doped with p-type dopant, such as boron. The protective layer 232 acts as a mask during the implantation process, such that to control the doped features 228A positioned in the upper portion of the LDD regions 228. The implantation process, in some embodiments, is performed with a tilt-angle process ranging between about 30° to about 60° to form the doped features 228A substantially aligned with the sidewalls of the LDD regions 228 adjacent to the gate structure 220. The doped features 228A and the remaining LDD regions 228 may have different etching rates during a subsequent etching process because of the different doping species therein. For example, the remaining LDD regions 228 with the n-type dopant (e.g., As) may have a etching rate greater than the etching rate of the doped features 228A because the doped features 228A include the p-type dopant (e.g., B) therein. Thus, the etching rate of the doped features 230A is greater than the etching rate of the remaining LDD regions 230.

Thereafter, the patterned resist or hard mask layer may be removed by a photoresist stripping or dry etching process, for example. In one embodiment, an anneal process may be provided to the substrate 210, after the stripping or dry etching process, to repair the crystalline structure of the substrate 210 damaged by the implantation process. The anneal process is performed with a nitrogen ambient under a temperature ranging between about 900° C. and about 1100° C.

Still referring to FIGS. 1 and 5, the method 100 continues with step 112 in which spacers are formed for gate structures 220 and 221. In the depicted embodiment, liners 240 and spacers 242 are formed by a suitable process. For example, a dielectric layer, such as a silicon nitride layer, is blanket deposited over the semiconductor device 200, including over the protective layer 232; and then, the dielectric layer and the protective layer 232 are anisotropically etched to remove portions of the dielectric layer to form the spacers 242 and portions of the protective layer 232 to form the liners 240 as illustrated in FIG. 5. The liners 240 and the spacers 242 are positioned adjacent the sidewalls of the gate structures 220 and 221 (gate dielectric 222, gate electrode 224, and hard mask 226). Alternatively, the spacers 242 include another dielectric material, such as silicon oxide, silicon oxynitride, or combinations thereof. The liners 240 may also comprise another suitable dielectric material.

Figure 6A:
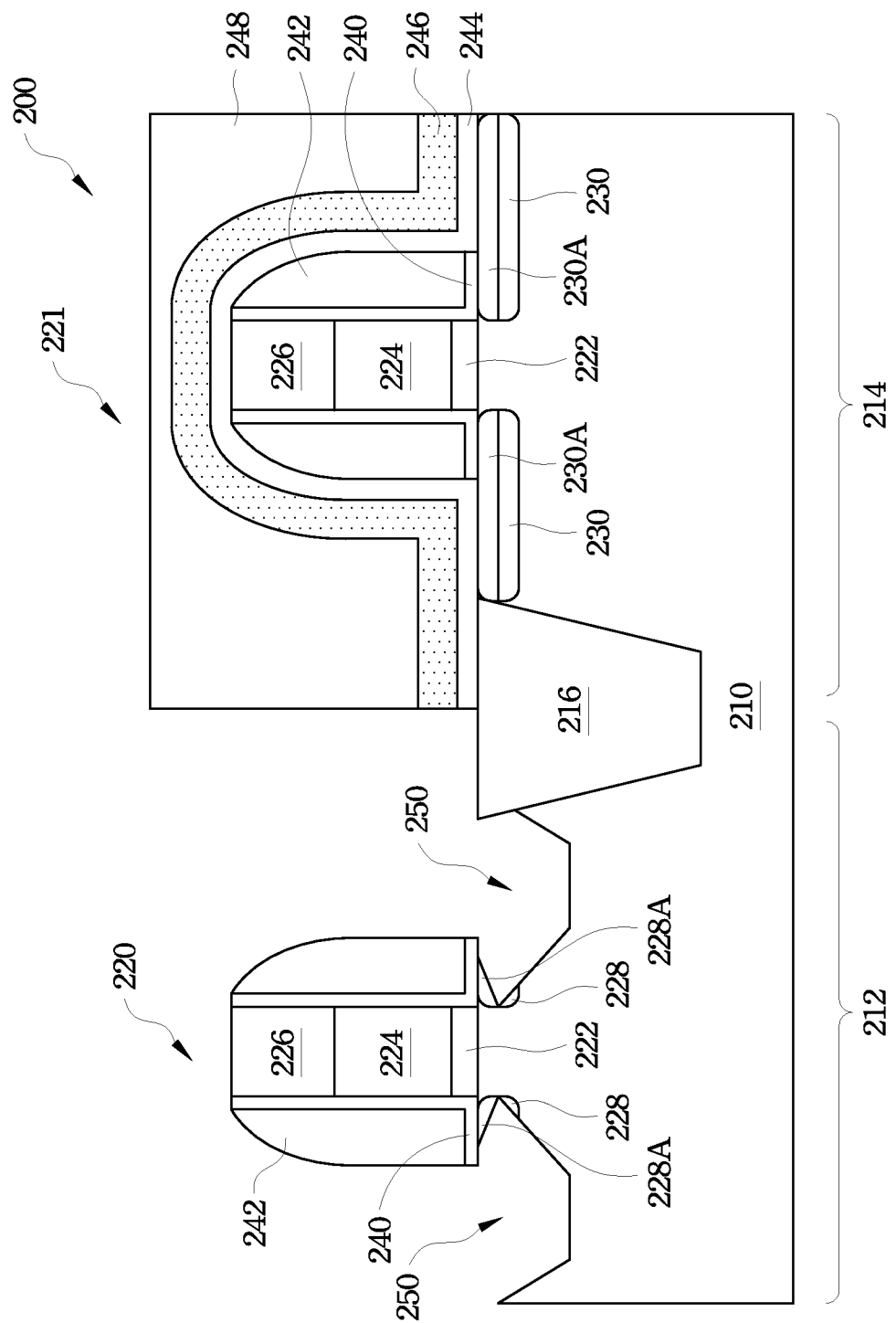
Figure 6B:
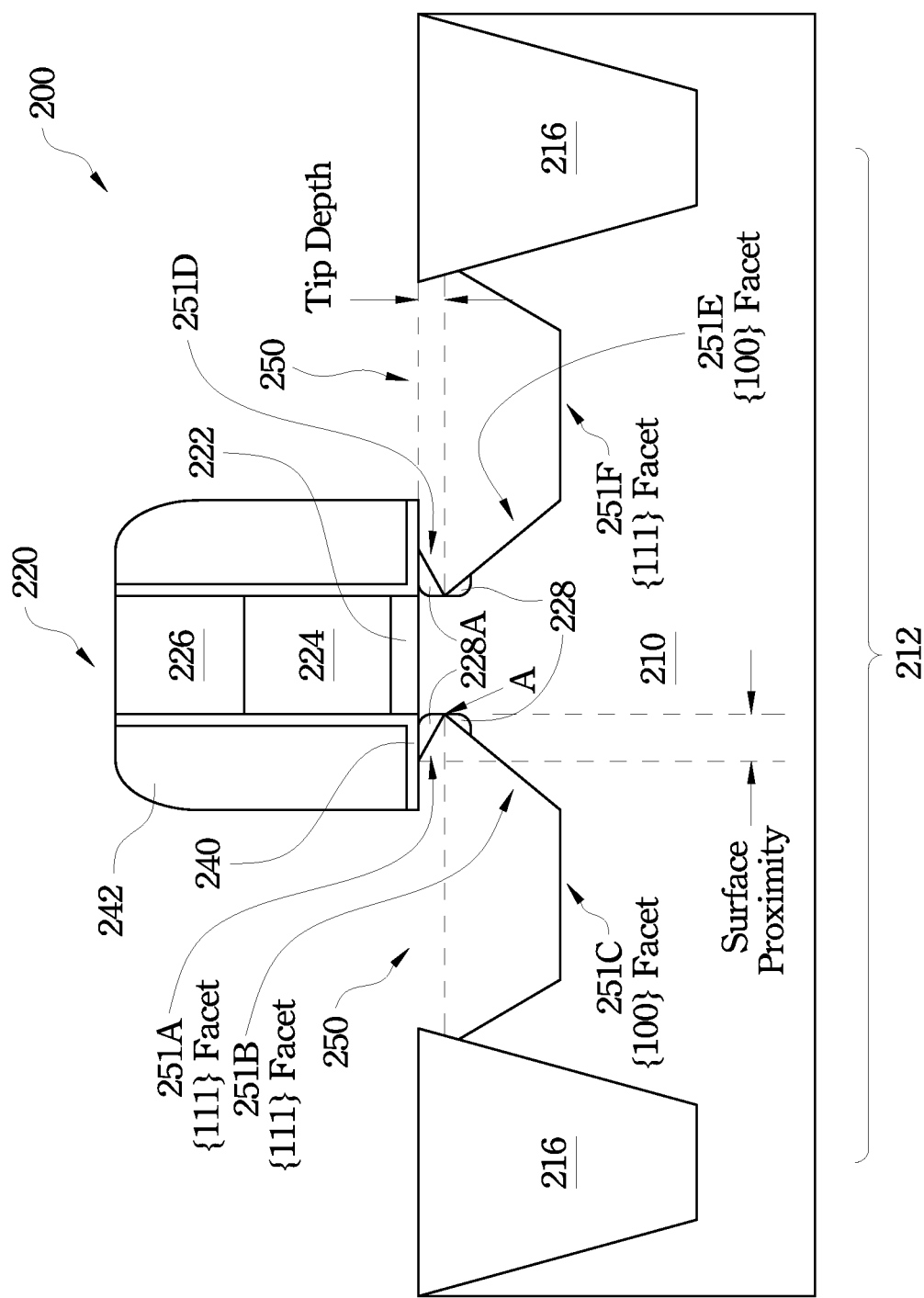
Figure 7:
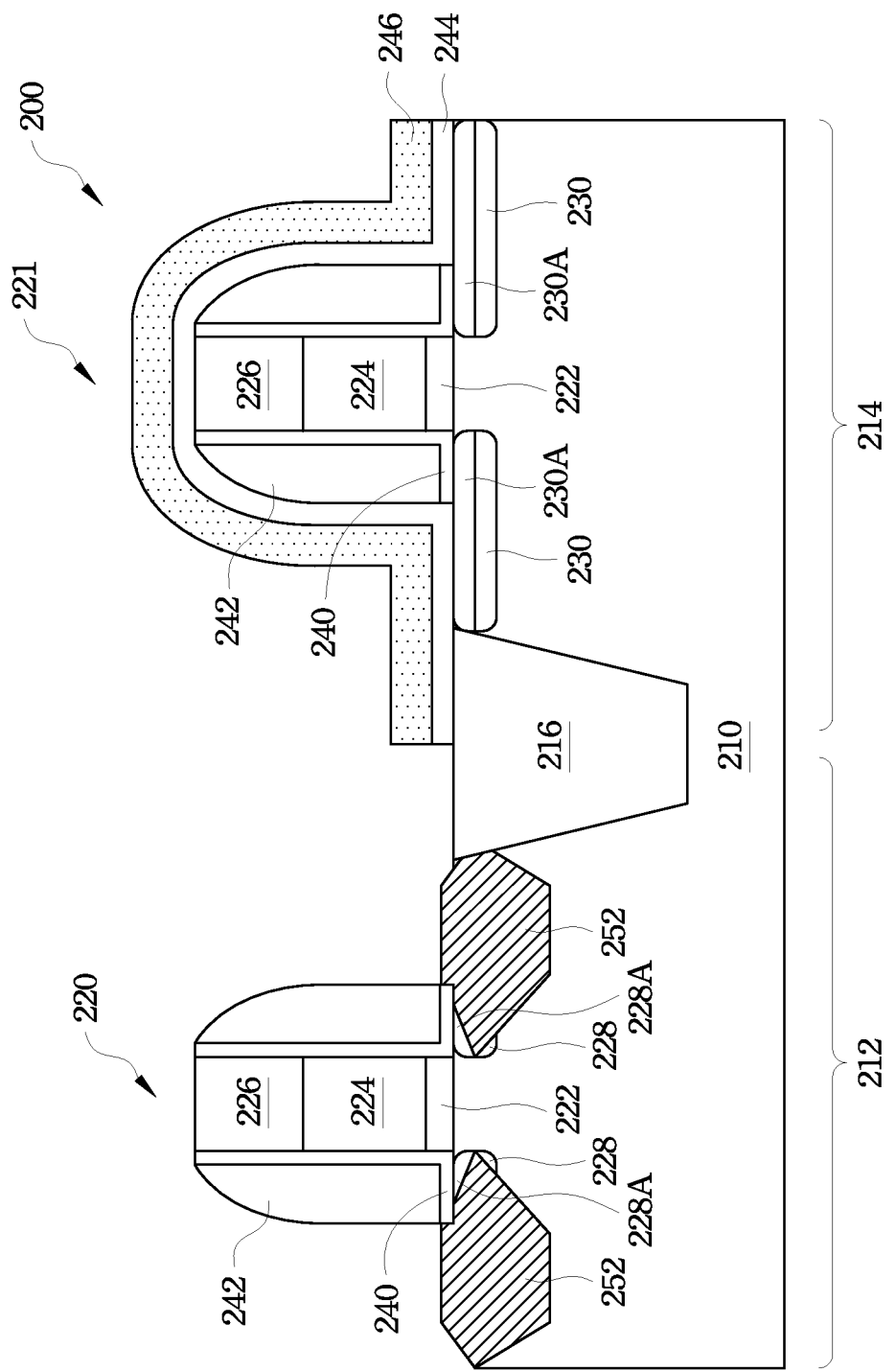

In FIGS. 6A, 6B, and 7, source/drain engineering is performed to configure the source/drain region of the NFET device region 212 for an NFET device and to configure the source/drain region of the PFET device region 214 for a PFET device. Referring to FIGS. 1 and 6A, the method 100 continues with step 114 in which portions of the substrate 210 are removed at either side of the gate structure 220 in the NFET device region 212, particularly in the source and drain region of the NFET device. In the depicted embodiment, a first capping layer 244, a second capping layer 246, and a photoresist layer 248 are formed over the semiconductor device 200 and then patterned to protect the PFET device during processing of the NFET device region 212. In one embodiment, the first capping layer 244 may comprise an oxide material and the second capping layer 246 may comprise a nitride material. The first and the second capping layers 244 and 246 may comprise other suitable materials as known in the art. The photoresist layer 248 may include an antireflective coating layer, such as a bottom antireflective coating (BARC) layer and/or a top antireflective coating (TARC) layer. The patterned layers 244, 246, and 248 may be formed by a photolithography process. An exemplary photolithography process may include processing steps of photoresist coating, soft baking, mask aligning, exposing, post-exposure baking, developing photoresist, and hard baking. The photolithography process may also be implemented or replaced by other proper techniques, such as maskless photolithography, electron-beam writing, ion-beam writing, and molecular imprint.

An etching process then removes portions of the substrate 210 to form recesses 250 in the substrate 210. The recesses 250 are formed in the source and drain regions of the NFET device in the NFET device region 212. The etching process includes a dry etching process, wet etching process, or combination thereof. In the depicted embodiment, the etching process utilizes a combination dry and wet etching. The dry and wet etching processes have etching parameters that can be tuned, such as etchants used, etching temperature, etching solution concentration, etching pressure, source power, RF bias voltage, RF bias power, etchant flow rate, and other suitable parameters. For example, the dry etching process may utilize an etching pressure of about 1 mT to about 200 mT, a source power of about 200 W to about 2000 W, an RF bias voltage of about 0 V to about 100 V, and an etchant that includes $NF_3$, $Cl_2$, $SF_6$, He, Ar, $CF_4$, or combinations thereof. In an example, the dry etching process includes an etching pressure of about 1 mT to about 200 mT, a source power of about 200 W to about 2000 W, an RF bias voltage of about 0 V to about 100 V, a $NF_3$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In another example, the etching process includes an etching pressure of about 1 mT to about 200 mT, a source power of about 200 W to about 2000 W, an RF bias voltage of about 0 V to about 100 V, a $SF_6$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In yet another example, the etching process includes an etching pressure of about 1 mT to about 200 mT, a source power of about 200 W to about 2000 W, an RF bias voltage of about 0 V to about 100 V, a $CF_4$ gas flow of about 5 sccm to about 100 sccm, a $Cl_2$ gas flow of about 0 sccm to about 100 sccm, an He gas flow of about 0 sccm to about 500 sccm, and an Ar gas flow of about 0 sccm to about 500 sccm. The wet etching solutions may include $NH_4OH$, HF (hydrofluoric acid), TMAH (tetramethylammonium hydroxide), other suitable wet etching solutions, or combinations thereof. In an example, the wet etching process first implements a 100:1 concentration of an HF solution at room temperature, and then implements a $NH_4OH$ solution at a temperature of about 20° C. to about 60° C. In another example, the wet etching process first implements a 100:1 concentration of an HF solution at room temperature, and then implements a TMAH solution at a temperature of about 20° C. to about 60° C. After the etching process, a pre-cleaning process may be performed to clean the recesses 250 with a hydrofluoric acid (HF) solution or other suitable solution.

The etching profile of the recesses 250 enhances performance of the semiconductor device 200. In FIG. 6B, the NFET device region 212 of the semiconductor device 200 is enlarged for better understanding of the etching profile of recesses 250. The etching profile of the recesses 250 defines source and drain regions of the NFET device, and the etching profile of the recesses is defined by facets 251A, 251B, 251C, 251D, 251E, and 251F of the substrate 210. The facets 251A, 251B, 251D, and 251E may be referred to as shallow facets, and the facets 251C and 251F may be referred to as bottom facets. In the depicted embodiment, the etching profile of the recesses 250 is defined by facets 251A, 251B, 251D, and 251E in a {111} crystallographic plane of the substrate 210, and facets 251C and 251F in a {100} crystallographic plane of the substrate 210. The etching profile of the recesses 250 defines a tip A substantially positioned at the intersection of the vertical sidewall and bottom surface of the doped features 228A around the gate structure 220. The recesses 250 further define a surface proximity and a tip depth (or height). The surface proximity defines a distance that a top surface of the substrate 210 extends from a sidewall of the gate structure (i.e., gate stack including gate dielectric layer 222, gate layer 224, and hard mask layer 226) to the recess 250 (or when the recess is filled, a source and drain feature). In the depicted embodiment, the disclosed etching profile of the recesses 250 achieves a surface proximity of about 1 nm to about 5 nm. The tip depth defines a distance between a top surface of the substrate 210 and an intersection of the facets 251A and 251B (or an intersection of the facets 251D and 251E). In one embodiment, the etching profile of the recesses 250 achieves a tip depth of about the depth d2 of the doped features 228A. In another embodiment, the etching profile of the recesses 250 achieves a tip depth of about 10 Angstroms to about 100 Angstroms.

Referring to FIGS. 1 and 7, the method 100 continues with step 116 in which a semiconductor material is formed in the recesses 250 to form a strained structure in the NFET device region 212. The semiconductor material forms source and drain features 252 in the recesses 250. The source and drain features 252 may alternatively be referred to as raised source and drain features. In the depicted embodiment, an epitaxy or epitaxial (epi) process is performed to form the semiconductor material in the recesses 250. The epi process may include a selective epitaxy growth (SEG) process, chemical vapor deposition (CVD) techniques (e.g., vapor-phase epitaxy (VPE) and/or ultra-high vacuum CVD (UHV-CVD)), molecular beam epitaxy (MBE), other suitable epi processes, or combination thereof. The epi process may use gaseous and/or liquid precursors, which may interact with the composition of the substrate 210. In the depicted embodiment, the patterned photoresist layer 248 protecting the PFET device region 214 is removed before the epi process. Further, in the depicted embodiment, the source and drain features 252 include epitaxially grown silicon (epi Si). The epi Si source and drain features 252 of the NFET device associated with the gate structure 220 may be in-situ doped or undoped during the epi process. For example, the epi Si source and drain features 252 may be doped with phosphorous to form Si:P source and drain features. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 252 may further be exposed to annealing processes, such as a rapid thermal annealing process. Thereafter, the patterned capping layers 246 and 244 are removed by a suitable process.

Figure 8A:
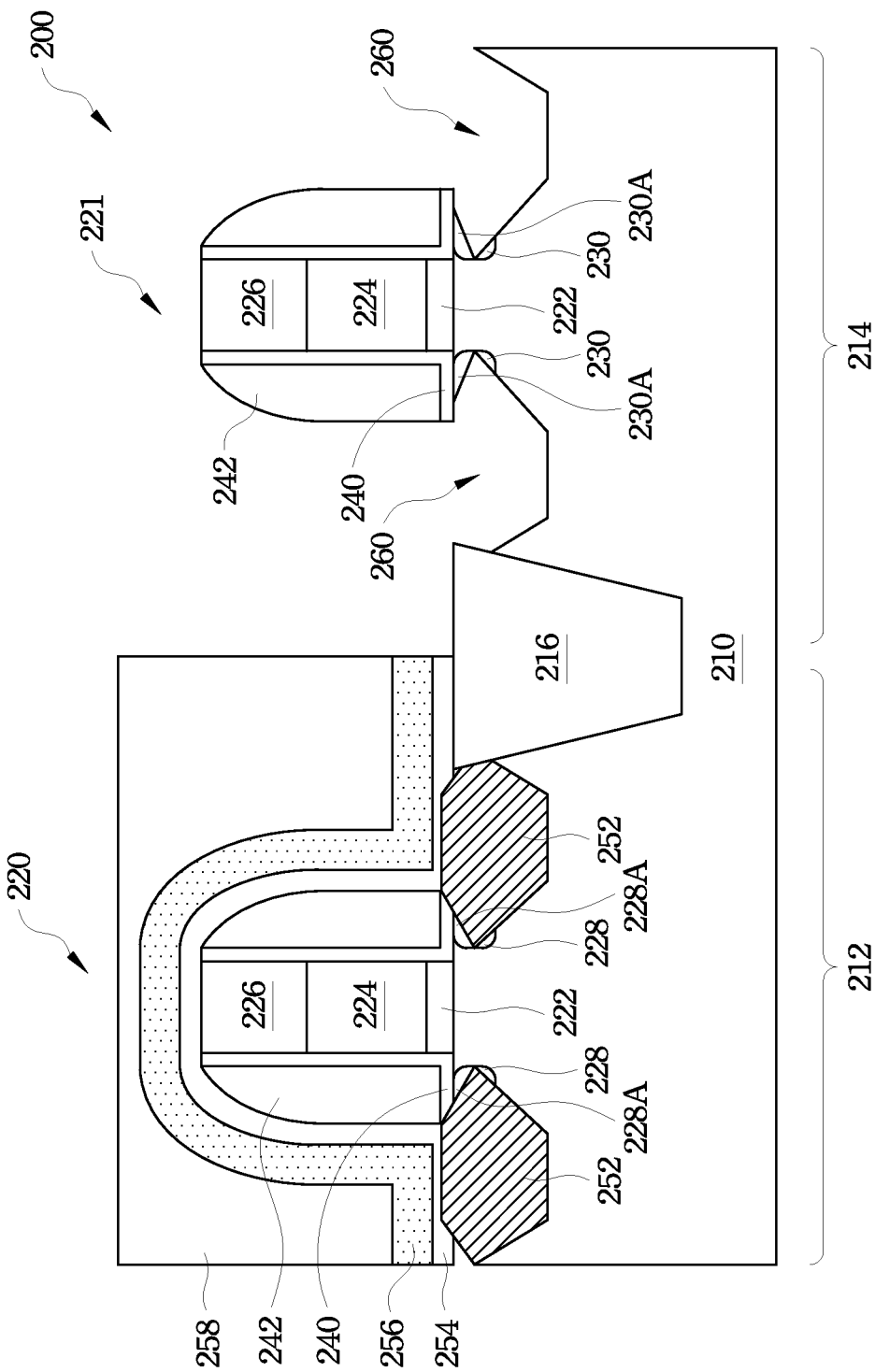
Figure 8B:
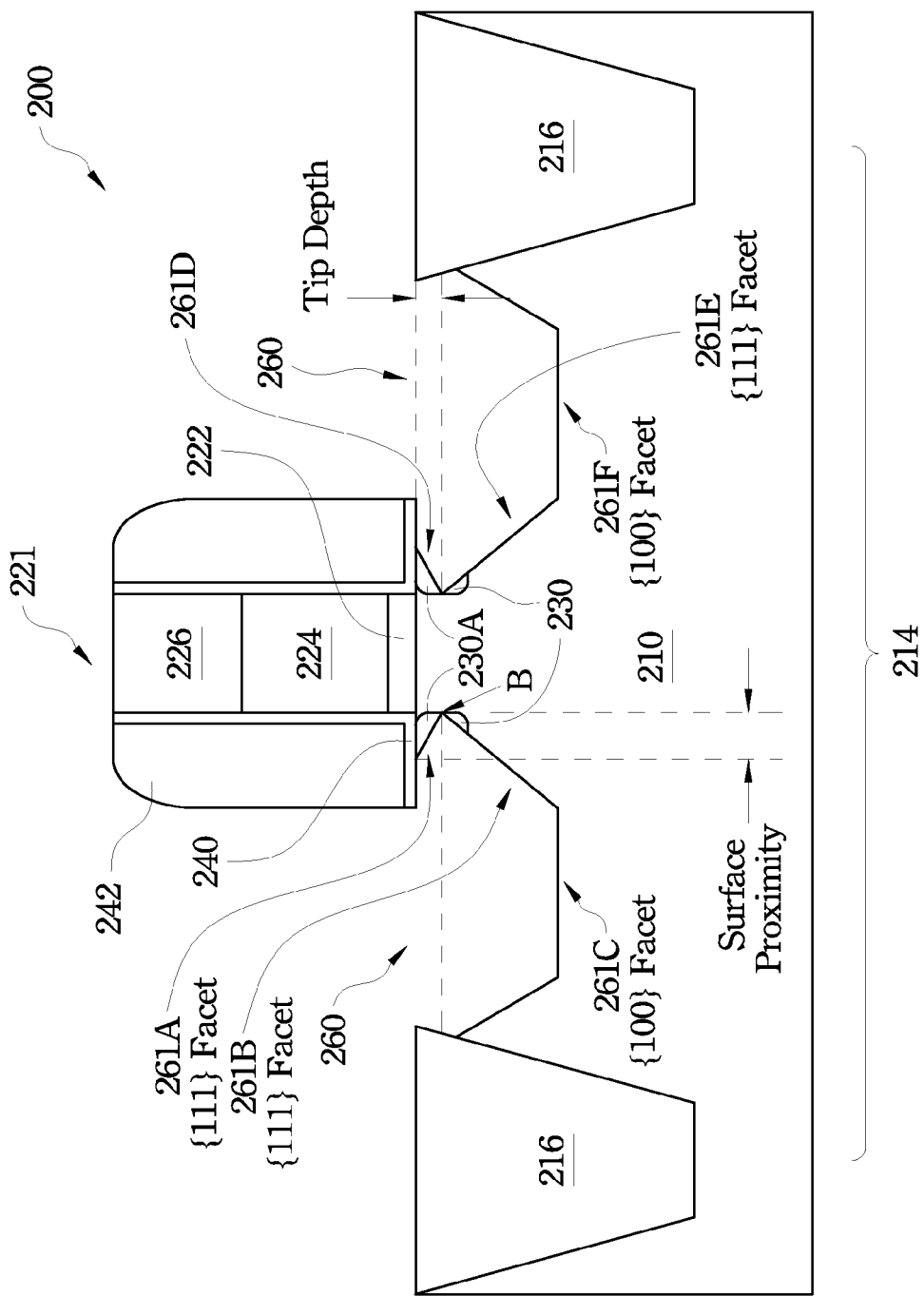
Figure 9:
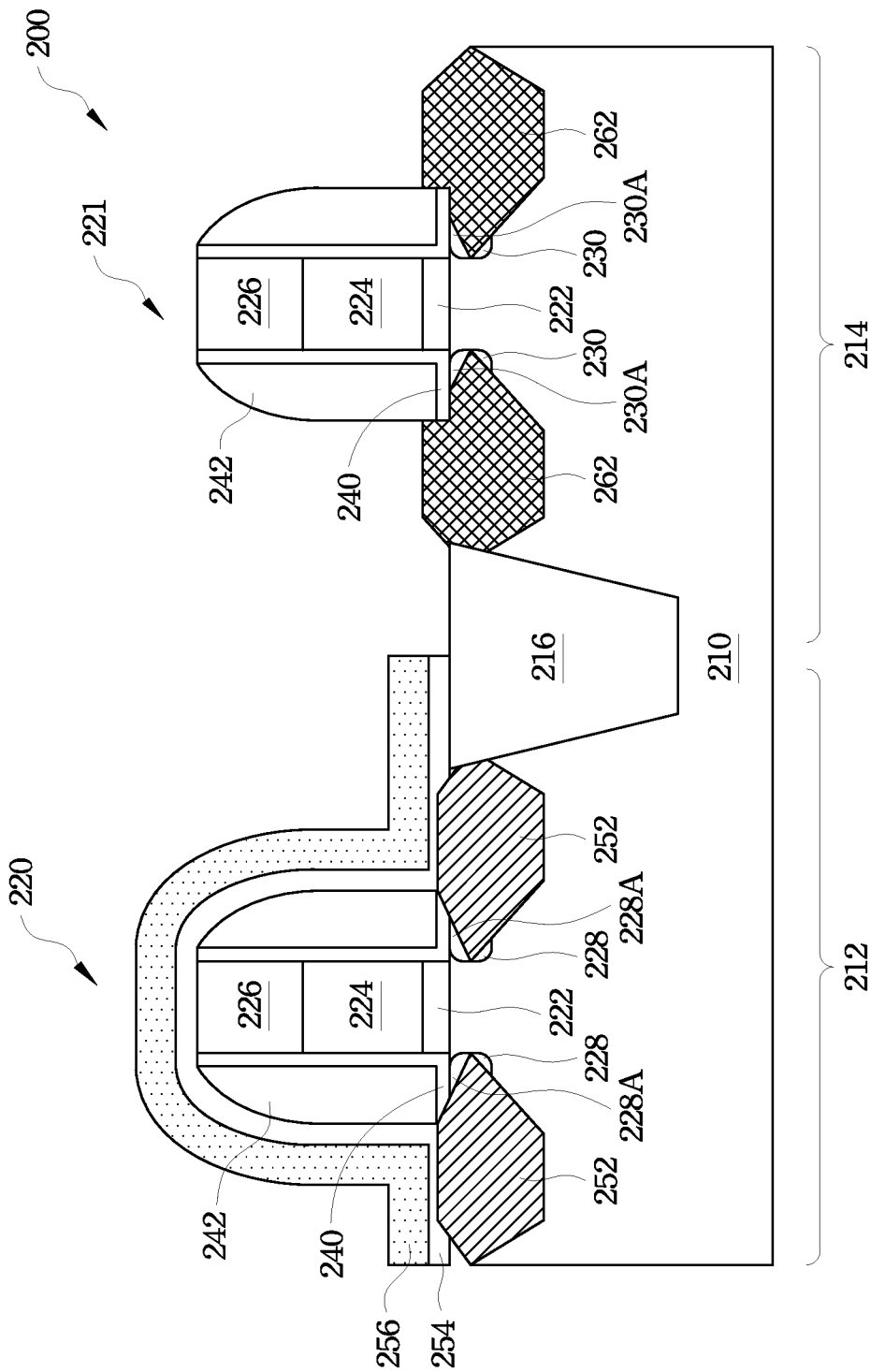

In FIGS. 8A, 8B, and 9, source/drain (S/D) features are formed in the PFET device region 214. Referring to FIGS. 1 and 8A, the method 100 continues with step 118 in which portions of the substrate 210 are removed at either side of the gate structure 221 in the PFET device region 214, particularly in the source and drain region of the PFET device. In the depicted embodiment, a first capping layer 254, a second capping layer 256, and a photoresist layer 258 are formed over the semiconductor device 200 and patterned to protect the NFET device 212 during processing of the PFET device region 214. The first capping layer 254 may comprise an oxide material, and the second capping layer 256 may comprise a nitride material. The first and second capping layers 254 and 256 may comprise other suitable materials. The photoresist layer 258 may include an antireflective coating layer, such as a BARC layer and/or a TARC layer. The patterned layers of 254, 256, and 258 may be formed by a photolithography process. An exemplary photolithography process may include processing steps of photoresist coating, soft baking, mask aligning, exposing, post-exposure baking, developing photoresist, and hard baking. The photolithography process may also be implemented or replaced by other proper techniques, such as maskless photolithography, electron-beam writing, ion-beam writing, and molecular imprint.

An etching process then removes portions of the substrate 210 to form recesses 260 in the substrate 210. The recesses 260 are formed in the source and drain regions of the PFET device in the PFET device region 214. The etching process includes a dry etching process, wet etching process, or combination thereof. In the depicted embodiment, the etching process utilizes a combination dry and wet etching. The dry and wet etching processes have etching parameters that can be tuned, such as etchants used, etching temperature, etching solution concentration, etching pressure, source power, RF bias voltage, RF bias power, etchant flow rate, and other suitable parameters. For example, the dry etching process may utilize an etching pressure of about 1 mT to about 200 mT, a source power of about 200 W to about 2000 W, an RF bias voltage of about 0 V to about 100 V, and an etchant that includes $NF_3$, $Cl_2$, $SF_6$, He, Ar, $CF_4$, or combinations thereof. In an example, the dry etching process includes an etching pressure of about 1 mT to about 200 mT, a source power of about 200 W to about 2000 W, an RF bias voltage of about 0 V to about 100 V, a $NF_3$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In another example, the etching process includes an etching pressure of about 1 mT to about 200 mT, a source power of about 200 W to about 2000 W, an RF bias voltage of about 0 V to about 100 V, a $SF_6$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In yet another example, the etching process includes an etching pressure of about 1 mT to about 200 mT, a source power of about 200 W to about 2000 W, an RF bias voltage of about 0 V to about 100 V, a $CF_4$ gas flow of about 5 sccm to about 100 sccm, a $Cl_2$ gas flow of about 0 sccm to about 100 sccm, an He gas flow of about 0 sccm to about 500 sccm, and an Ar gas flow of about 0 sccm to about 500 sccm. The wet etching solutions may include $NH_4OH$, HF (hydrofluoric acid), TMAH (tetramethylammonium hydroxide), other suitable wet etching solutions, or combinations thereof. In an example, the wet etching process first implements a 100:1 concentration of an HF solution at room temperature, and then implements a $NH_4OH$ solution at a temperature of about 20° C. to about 60° C. (for example, to form a {111} facet). In another example, the wet etching process first implements a 100:1 concentration of an HF solution at room temperature, and then implements a TMAH solution at a temperature of about 20° C. to about 60° C. (for example, to form a {111} facet). After the etching process, a pre-cleaning process may be performed to clean the recesses 260 with a hydrofluoric acid (HF) solution or other suitable solution.

The etching profile of the recesses 260 enhances performance of the semiconductor device 200. In FIG. 8B, the PFET device region 214 of the semiconductor device 200 is enlarged for better understanding of the etching profile of recesses 260. The etching profile of the recesses 260 defines source and drain regions of the PFET device, and the etching profile of the recesses is defined by facets 261A, 261B, 261C, 261D, 261E, and 261F of the substrate 210. The facets 261A, 261B, 261D, and 261E may be referred to as shallow facets, and the facets 261C and 261F may be referred to as bottom facets. In the depicted embodiment, the etching profile of the recesses 260 is defined by facets 261A, 261B, 261D, and 261E in a {111} crystallographic plane of the substrate 210, and facets 261C and 261F in a {100} crystallographic plane of the substrate 210. The etching profile of the recesses 260 defines a tip B substantially positioned at the intersection of the vertical sidewall and bottom surface of the doped features 230A around the gate structure 221. The recesses 260 further define a surface proximity and a tip depth (or height). The surface proximity defines a distance that a top surface of the substrate 210 extends from a sidewall of the gate structure (i.e., gate stack including gate dielectric layer 222, gate layer 224, and hard mask layer 226) to the recess 260 (or when the recess is filled, a source and drain feature). In the depicted embodiment, the disclosed etching profile of the recesses 250 achieves a surface proximity of about 1 nm to about 5 nm. The tip depth defines a distance between a top surface of the substrate 210 and an intersection of the facets 261A and 261B (or an intersection of the facets 261D and 261E). In one embodiment, the etching profile of the recesses 260 achieves a tip depth of about the depth d1 of the doped features 230A. In another embodiment, the etching profile of the recesses 260 achieves a tip depth of about 10 Angstroms to about 100 Angstroms.

The etching profile of the recesses 250 and 260, which improves device performance, is achieved by the method 100 described herein. Typically, to enhance the performance of the semiconductor device 200, a trade-off occurs. For example, conventional processing reduces the surface proximity to improve saturation current, which often results in a larger tip height, thus leading to increased short channel effects and reduced on/off speed of the integrated circuit device. Accordingly, precise control over the etching profile of the recesses 250 and 260 is desired, particularly precise control over the resulting surface proximity and tip shape of the source and drain regions. The disclosed method 100 provides this desired control, resulting in the etching profile of recesses 250 and 260 as described with reference to FIGS. 6A, 6B, 8A and 8B. As noted above, additional implantation process implemented to form the doped features 228A decreases the etching rate of the substrate 210 for the etching processes used to from the recesses 250 to reduce the surface proximity and improve saturation current; and additional implantation process implemented to form the doped features 230A enhances the etching rate of the substrate 210 for the etching processes used to from the recesses 260 to result a smaller tip height to decrease short channel effects and increase on/off speed of the integrated circuit device.

Referring to FIGS. 1 and 9, the method 100 continues with step 120 wherein a semiconductor material is deposited in the recesses 260 to form a strained structure in the PFET device region 214. In the depicted embodiment, an epitaxy or epitaxial (epi) process is performed to deposit the semiconductor material in the recesses 260. The epi process may include a selective epitaxy growth (SEG) process, CVD deposition techniques (e.g., vapor-phase epitaxy (VPE) and/or ultra-high vacuum CVD (UHV-CVD)), molecular beam epitaxy (MBE), other suitable epi processes, or combination thereof. The epi process may use gaseous and/or liquid precursors, which may interact with the composition of the substrate 210. The deposited semiconductor material is different from the substrate 210. Accordingly, the channel region of the PFET device is strained or stressed to enable carrier mobility of the device and enhance device performance. In the depicted embodiment, the patterned photoresist layer 258 protecting the NFET device region 212 is removed before the epi process. Further, in the depicted embodiment, silicon germanium (SiGe) is deposited by an epi process in the recesses 260 of the substrate 210 to form SiGe source and drain features 262 in a crystalline state on the silicon substrate 210. The SiGe source and drain features 262 may alternatively be referred to as raised source and drain features. The source and drain features 262 of the PFET device associated with the gate structure 221 may be in-situ doped or undoped during the epi process. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 262 may further be exposed to annealing processes, such as a rapid thermal annealing process.

Figure 10:
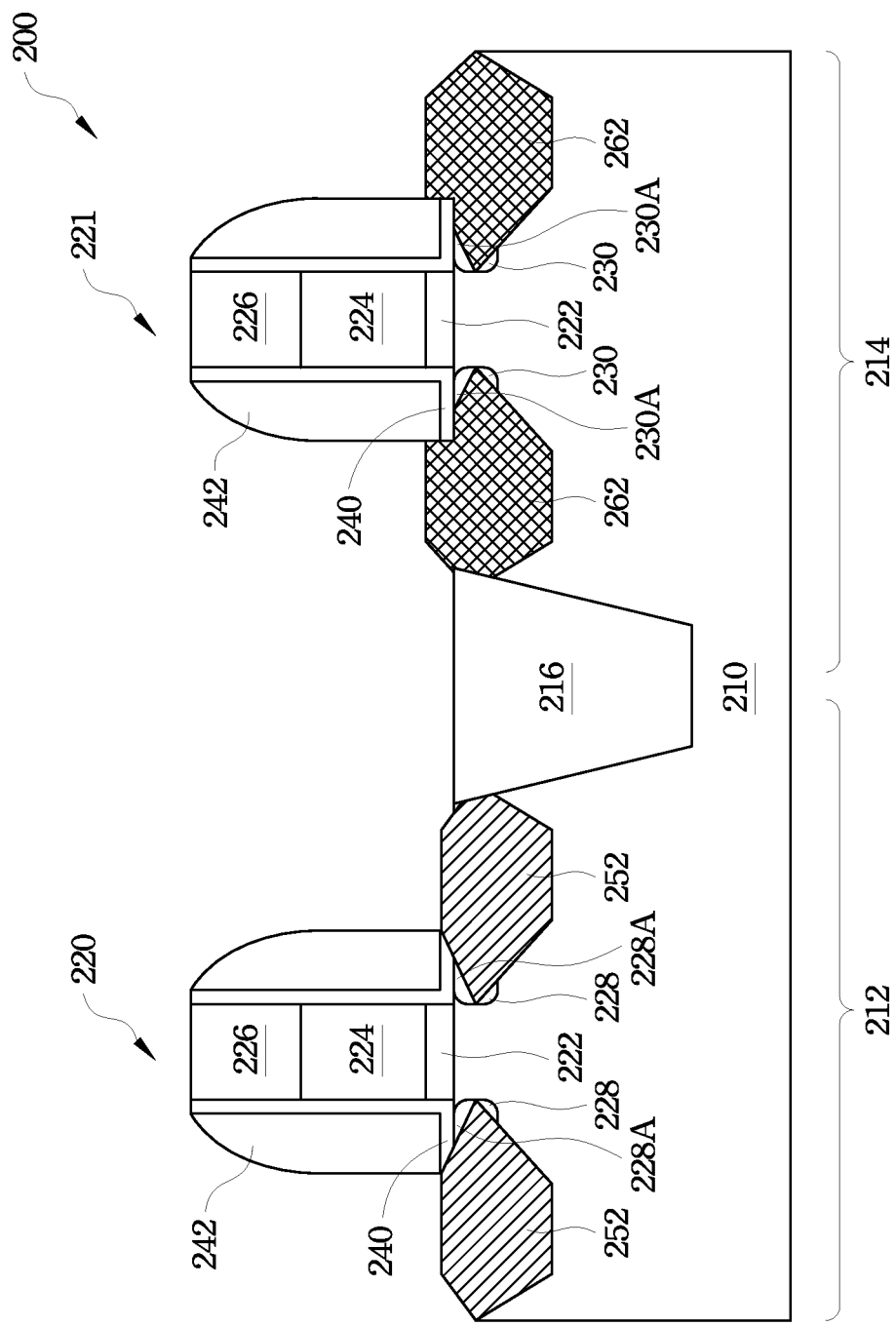

Thereafter, the patterned capping layers 254 and 256 are removed by a suitable process as illustrated in FIG. 10. The semiconductor 200 continues with processing to complete fabrication as discussed briefly below. For example, heavily doped source/drain (HDD) regions for the NFET device in the NFET device region 212 may be formed by ion implantation of n-type dopants, such as phosphorous or arsenic, and HDD regions for the PFET device in the PFET device region 214 may be formed by ion implantation of p-type dopants, such as boron. It is understood that the HDD regions of the NFET and PFET device regions 212 and 214 may be formed earlier than in the depicted embodiment. Additionally, silicide features are formed on the raised source/drain features, for example, to reduce the contact resistance. The silicide features may be formed on the source and drain regions by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the substrate to planarize the substrate. Further, a contact etch stop layer (CESL) may be formed on top of the gate structures 220 and 221 before forming the ILD layer. In an embodiment, the gate electrode 224 remains poly in the final device. In another embodiment, the poly is removed and replaced with a metal in a gate last or gate replacement process. In a gate last process, the CMP process on the ILD layer is continued to expose the poly of the gate structures, and an etching process is performed to remove the poly, thereby forming trenches. The trenches are filled with a proper work function metal (e.g., p-type work function metal and n-type work function metal) for the PFET devices and the NFET devices.

A multilayer interconnection (MLI) including metal layers and inter-metal dielectric (IMD) is formed over the substrate 210 to electrically connect various features or structures of the semiconductor device 200. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper multilayer interconnection structure.

In summary, the disclosed method 100 provides improved control over surface proximity and tip depth in the semiconductor device 200. The improved control is achieved by, after forming LDD regions, performing an additional implant to form doped areas in the source and drain regions of a device. The doped areas are formed by implanting the substrate with a dopant type opposite to a dopant type used to form the LDD region. It has been observed that the disclosed methods and integrated circuit devices result in improved device performance, including but not limited to, improved control over short channel effects, increased saturation current, improved control of metallurgical gate length, increased carrier mobility, and decreased contact resistance between the source/drain and silicide features. It is understood that different embodiments may have different advantages, and that no particular advantage is necessarily required of any embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate structure over a substrate;
   forming a source/drain feature that includes a first-type dopant in the substrate adjacent the gate structure;
   forming a doped feature that includes a second-type dopant in the substrate over the source/drain feature such that the doped feature is disposed in the substrate above the source/drain feature, wherein the second-type dopant is opposite the first-type dopant;
   removing at least a portion of the doped feature to form a recess in the substrate; and
   forming another source/drain feature in the recess.

2. The method of claim 1, wherein removing at least the portion of the doped feature to form the recess in the substrate includes removing at least a portion of the source/drain feature to form the recess.

3. The method of claim 1, wherein removing at least the portion of the doped feature to form the recess in the substrate includes performing a dry etching process and a wet etching process.

4. The method of claim 1, further comprising forming a dielectric layer over the semiconductor substrate prior to forming the doped feature of the second-type in the substrate over the source/drain feature such that the doped feature is formed through the dielectric layer.

5. The method of claim 2, wherein after removing at least the portion of the doped feature to form the recess in the substrate a remaining portion of the doped feature remains in the substrate and defines the recess.

6. The method of claim 5, wherein after removing at least the portion of the source/drain feature to form the recess a remaining portion of the source/drain feature remains in the substrate and defines the recess.

7. The method of claim 6, wherein the another source/drain feature physically contacts the remaining portion of the source/drain feature and the remaining portion of the doped feature.

8. A method comprising:
   forming a first gate structure and a second gate structure over a substrate;
   forming a first source/drain feature that includes a first-type dopant in the substrate adjacent the first gate structure;
   forming a second source/drain feature that includes a second-type dopant in the substrate adjacent the second gate structure, wherein the second-type dopant is opposite the first-type dopant;
   forming a first doped feature that includes the second-type dopant in the substrate over the first source/drain feature such that the first doped feature is disposed in the substrate above the first source/drain feature;
   removing a portion of the first doped feature to form a first recess in the substrate; and
   forming a first semiconductor material in the first recess.

9. The method of claim 8, wherein removing the portion of the first doped feature to form the first recess in the substrate includes removing a portion of the first source/drain feature to form the first recess,
   wherein after removing the portion of the first doped feature, another portion of the first doped feature remains within the substrate to define a sidewall of the first recess, and wherein after removing the portion of the first source/drain feature, another portion of the first source/drain feature remains within the substrate to define another sidewall of the first recess.

10. The method of claim 8, further comprising:
forming a second doped feature that includes the first-type dopant in the substrate over the second source/drain feature;
removing a portion of the second doped feature to form a second recess in the substrate; and
forming a second semiconductor material in the second recess, the second semiconductor material being different than the first semiconductor material.

11. The method of claim 8, further comprising:
forming a first capping layer over the second gate structure;
forming a second capping layer over the first capping layer, and
wherein removing the portion of the first doped feature to form the first recess in the substrate occurs after forming the first and second capping layers.

12. The method of claim 8, further comprising forming an oxide layer over the first source/drain feature, wherein the first doped feature is formed through the oxide layer.

13. The method of claim 8, wherein forming the first source/drain feature that includes the first-type dopant in the substrate adjacent the first gate structure is performed by a tilted angled implantation process with respect to a top surface of the substrate, wherein the tilted angled implantation process is performed at angle ranging from about 30° to about 60° with respect to the top surface of the substrate.

14. The method of claim 10, wherein removing the portion of the second doped feature to form the second recess in the substrate includes removing a portion of the second source/drain feature to form the second recess,
wherein after removing the portion of the second doped feature, another portion of the second doped feature remains within the substrate to define a sidewall of the second recess, and
wherein after removing the portion of the second source/drain feature, another portion of the second source/drain feature remains within the substrate to define another sidewall of the second recess.

15. A method comprising:
forming a gate structure over a substrate;
forming a source/drain feature that includes a first-type dopant in the substrate adjacent the gate structure;
forming a doped feature that includes a second-type dopant in the substrate over the source/drain feature such that the doped feature interfaces with the source/drain feature and is disposed in the substrate above the source/drain feature, wherein the second-type dopant is opposite the first-type dopant;
removing at least a portion of the doped feature to form a recess in the substrate; and
forming a semiconductor feature in the recess.

16. The method of claim 15, wherein the source/drain feature is a lightly doped source/drain feature.

17. The method of claim 15, further comprising forming a shallow trench isolation structure within the substrate,
wherein the recess exposes a sidewall portion of the shallow trench isolation structure, and
wherein the semiconductor feature physically contacts the sidewall portion of the shallow trench isolation structure.

18. The method of claim 15, further comprising:
forming another gate structure over the substrate;
forming another source/drain feature that includes the second-type dopant in the substrate adjacent the another gate structure;
forming another doped feature that includes the first-type in the substrate over the another source/drain feature such that the another doped feature interfaces with the another source/drain feature;
after forming the semiconductor feature in the recess, removing at least a portion of the another doped feature to form another recess in the substrate; and
forming another semiconductor feature in the another recess, the another semiconductor feature being formed of a different material than the semiconductor feature.

19. The method of claim 18, further comprising:
forming a photoresist layer over the another gate structure, and
wherein the photoresist layer covers the another gate structure during the forming of the doped feature that includes the second-type dopant in the substrate over the source/drain feature.

20. The method of claim 18, forming a first capping layer over the another gate structure;
forming a second capping layer over the first capping layer;
forming a photoresist layer over the second capping layer;
removing the photoresist layer prior to forming the semiconductor feature in the recess, and
wherein the first capping layer, the second capping layer, and the photoresist layer cover the another gate structure during the removing of at least the portion of the doped feature to form the recess in the substrate.

* * * * *